(12) United States Patent
Yoshioka et al.

(10) Patent No.: US 9,774,345 B1
(45) Date of Patent: Sep. 26, 2017

(54) SUCCESSIVE APPROXIMATION REGISTER ANALOG-TO-DIGITAL CONVERTER

(71) Applicant: KABUSHIKI KAISHA TOSHIBA, Tokyo (JP)

(72) Inventors: Kentaro Yoshioka, Kanagawa (JP); Masanori Furuta, Kanagawa (JP); Hiroshi Kubota, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/448,547

(22) Filed: Mar. 2, 2017

(30) Foreign Application Priority Data

Sep. 20, 2016 (JP) .................................. 2016-183524

(51) Int. Cl.
 *H03M 7/04* (2006.01)
 *H03M 1/46* (2006.01)
 *H03M 1/80* (2006.01)

(52) U.S. Cl.
 CPC ........... *H03M 1/466* (2013.01); *H03M 1/804* (2013.01)

(58) Field of Classification Search
 CPC .............................. H03M 1/466; H03M 1/804
 See application file for complete search history.

(56) References Cited

U.S. PATENT DOCUMENTS 4,399,426 A * 8/1983 Tan ..................... H03M 1/1023
 341/120

5,825,316 A * 10/1998 Kuttner ............... H03M 1/1052
 341/120
7,061,416 B2   6/2006 Nagai
(Continued)

FOREIGN PATENT DOCUMENTS

| JP | 2006140600 A | 6/2006 |
| JP | 5204176 B2 | 6/2013 |
| JP | 2015211391 A | 11/2015 |

OTHER PUBLICATIONS

Jeffrey A. Fredenburg et al., "A 90-MS/s 11-MHz-Bandwidth 62-dB SNDR Noise-Shaping SAR ADC", IEEE Journal of Solid-State Circuit, vol. 47, No. 12, Dec. 2012, pp. 2898-2904.

(Continued)

*Primary Examiner* — Khai M Nguyen
(74) *Attorney, Agent, or Firm* — Patterson & Sheridan, LLP

(57) ABSTRACT

A successive approximation register analog-to-digital converter includes a capacitance digital-to-analog converter (CDAC) having, a voltage storing circuit connected to an output terminal of the CDAC and including a plurality of capacitors connected in parallel, an output voltage of the CDAC being stored in a selected one of the capacitors, a selector configured to output a voltage stored in the selected one of the capacitors, a comparator configured to compare a voltage input to an input terminal thereof, which is connected to an output terminal of the CDAC, with a reference voltage, and a successive approximation register configured to control the CDAC based on an output of the comparator, and cyclically control the voltage storing circuit and the selector, such that the output of the selector is output to the output terminal one or more cycles after the output voltage was stored in the selected one of the capacitors.

20 Claims, 14 Drawing Sheets

(56) References Cited

U.S. PATENT DOCUMENTS 8,416,115 B2    4/2013   Araki et al.
8,947,285 B2    2/2015   Ceballos

OTHER PUBLICATIONS

Yun-Shiang Shu et al., "An Oversamplina SAR ADC with DAC Mismatch Error Shaping Achieving 105dB SFDR and 101dB SNDR over lkHz BW in 55nm CMOS" IEEE International Solid-State Circuits Conference, Sep. 2016, 3 pages.

\* cited by examiner

SUCCESSIVE APPROXIMATION REGISTER ANALOG-TO-DIGITAL CONVERTER

CROSS-REFERENCE TO RELATED APPLICATION

This application is based upon and claims the benefit of priority from Japanese Patent Application No. 2016-183524, filed Sep. 20, 2016, the entire contents of which are incorporated herein by reference.

FIELD

Embodiments described herein relate generally to a successive approximation register analog-to-digital converter.

BACKGROUND

In the related art, a successive approximation register analog-to-digital converter (SAR-ADC) of one type stores a residual voltage of a capacitance DA converter (CDAC), and performs noise shaping adding the stored residual voltage to the output of the CDAC in a next conversion cycle, so as to broaden an AD conversion frequency range. High-order noise shaping is necessary to broaden the AD conversion frequency range through the noise shaping, and a configuration that enables such a high-order noise shaping with high accuracy is desired.

DETAILED DESCRIPTION

Figure 1:
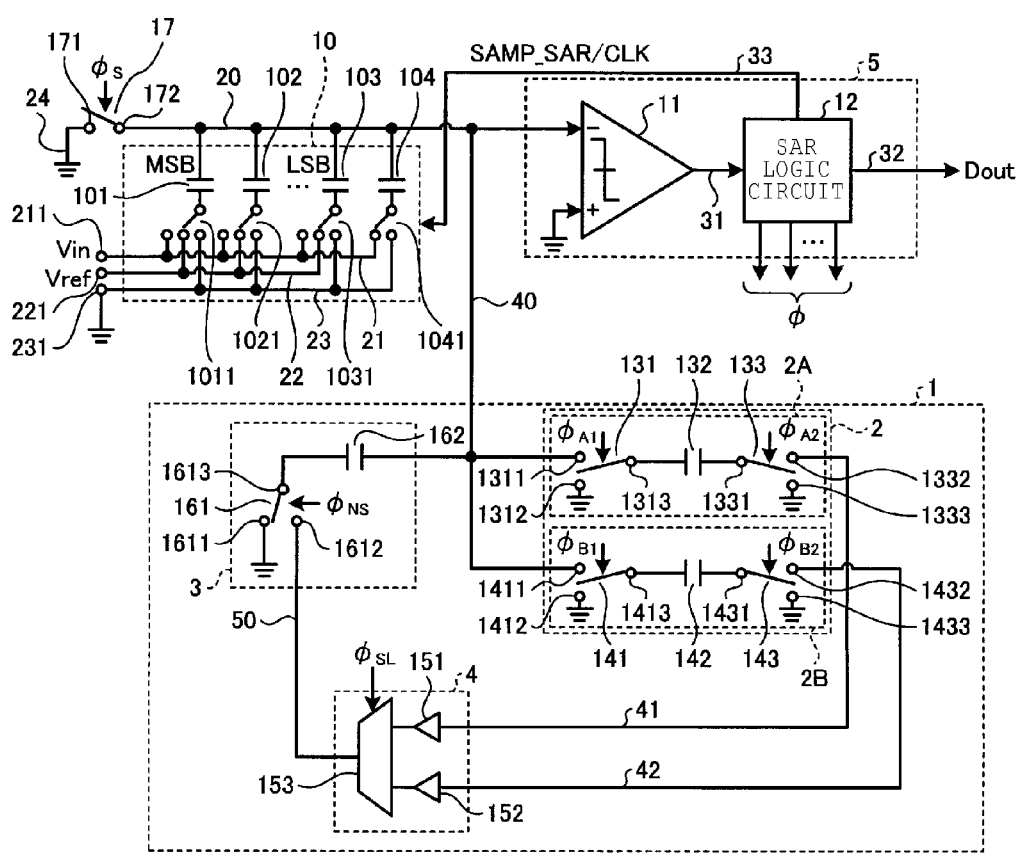
FIG. 1 illustrates a configuration of a SAR-ADC according to a first embodiment.

An embodiment provides a successive approximation register AD converter capable of implementing high-order noise shaping with high accuracy.

In general, according to an embodiment, a successive approximation register analog-to-digital converter includes a capacitance digital-to-analog converter (CDAC) having an input terminal to which an analog signal is input and an output terminal from which an output voltage is output, a voltage storing circuit connected to the output terminal and including a plurality of capacitors connected in parallel, the output voltage being stored in a selected one of the capacitors, a selector configured to output a voltage stored in the selected one of the capacitors, a comparator configured to compare a voltage input to an input terminal thereof, which is connected to the output terminal of the CDAC, with a reference voltage, and a successive approximation register (SAR) configured to control the CDAC based on an output of the comparator, and cyclically control the voltage storing circuit and the selector, such that the output of the selector is output to the output terminal one or more cycles after the output voltage was stored in the selected one of the capacitors.

Hereinafter, successive approximation register analog-to-digital (AD) converters according to embodiments will be described with reference to the accompanying drawings. A same reference numeral is assigned to corresponding elements in the embodiments, and duplicate description thereof will not be presented unless necessary. The present disclosure is not limited to such embodiments.

First Embodiment

FIG. 1 illustrates a configuration of a SAR-ADC according to a first embodiment. The SAR-ADC according to the first embodiment includes a CDAC 10, a comparison circuit 11, a SAR logic circuit 12, and a residual voltage feedback unit 1. For the convenience of description, the comparison circuit 11 and the SAR logic circuit 12 will be denoted as a conversion unit 5 hereinafter.

The CDAC 10 includes a plurality of capacitance elements 101 to 104 for which predetermined weights are applied. One end side of the capacitance elements 101 to 104 are connected to a signal line 20. The other ends of the capacitance elements 101 to 103 that are binary weighted are respectively connected to signal lines 211, 221, and 231 via switches 1011, 1021, and 1031. The other end of the dummy capacitance element 104 is connected to signal lines 211 and 231 via a switch 1041. For example, the capacitance of the dummy capacitance element 104 is equal to the capacitance of the LSB capacitance element 103. An input voltage Vin is applied to the signal line 211. A reference voltage Vref is applied to the signal line 221, and the signal line 231 is grounded.

One end 172 of the signal line 20 is connected to a terminal 171 via a switch 17. The terminal 171 is grounded via a signal line 24. The signal line 20 is grounded in a state in which the switch 17 is turned on by a control signal $\phi s$, in other words, when the input voltage Vin is input to the CDAC 10.

A sampling signal SAMP_SAR and a clock signal CLK are supplied from the SAR logic circuit 12 to switches 1011, 1021, 1031, and 1041 of the CDAC 10. In response to the sampling signal SAMP_SAR and the clock signal CLK, the switches 1011, 1021, 1031, and 1041 perform switching between the other ends of the capacitance elements 101, 102, 103, and 104 and the signal lines 211, 221, and 231.

When the input voltage Vin is input, in other words, when the input voltage Vin is sampled, the switches 1011, 1021, and 1031 connect the other ends of the capacitance elements to the signal line 211. After the input of the input voltage Vin, the switch 17 is turned off.

A conversion operation of the CDAC 10, for example, is performed using a binary search algorithm. In other words, as a first step, a lower end of the capacitance element 101 of the MSB is disconnected from the signal line 211 and is connected to the signal line 221 to which the reference voltage Vref is applied. At this time, the electric potential of the signal line 20 is increased by Vref/2 in the positive direction. Thus, the electric potential of the signal line 20 becomes −Vin+Vref/2. This electric potential of the signal line 20 and the ground electric potential are compared with each other by the comparison circuit 11. When the input voltage Vin is higher than Vref/2, the comparison circuit 11 outputs logic "1". On the other hand, when Vin is lower than Vref/2, the comparison circuit 11 outputs logic "0". The lower end of the MSB capacitance element 101 remains to be in the state being connected to the reference voltage Vref in a case where the output of the comparison circuit 11 is "1" and is grounded in a case where the output is "0".

In the next step, a lower end of the capacitance element 102 having next smallest capacitance is connected to the reference voltage Vref, and the electric potential of the signal line 20 and the ground electric potential are compared with each other by the comparison circuit 11. Similarly, the lower end of the capacitance element 102 remains to be in the state being connected to the reference voltage Vref in a case where the electric potential of the signal line 20 is higher than the ground electric potential, in other words, in a case where the output of the comparison circuit 11 is the logic "1," and is grounded in a case where the output is the logic "0". Such a comparison operation is performed until all bits are determined. According to the clock signal CLK output by the SAR logic circuit 12 based on whether the output signal supplied via the signal line 31 by the comparison circuit 11 is the logic "1" or the logic "0" through such successive conversion operations, the connection state of each switch is controlled.

The SAR logic circuit 12 outputs a logic signal of an MSB to an LSB output by the comparison circuit 11, from a signal line 32 as a digital signal Dout. In addition, the SAR logic circuit 12 outputs a control signal $\phi$ (representing all the control signals) used for controlling each switch.

The signal line 20 is connected to the residual voltage feedback unit 1 via a signal line 40. The residual voltage feedback unit 1 includes a residual voltage storing unit 2. The residual voltage storing unit 2 includes residual voltage storing circuits 2A and 2B. The residual voltage storing circuit 2A includes a capacitance element 132. A terminal 1313 of the capacitance element 132 arranged on one end side is connected to be switchable to a terminal 1311 or a ground terminal 1312 by using a switch 131. A terminal 1331 of the capacitance element 132 arranged on the other end side is connected to be switchable to a terminal 1332 or a ground terminal 1333 by using a switch 133. The terminal 1332 is connected to a signal line 41.

When a residual voltage is sampled, the switch 131 is connected to the terminal 1311, and the switch 133 is connected to the ground terminal 1333. On the other hand, when a residual voltage stored in the residual voltage storing circuit 2A is output, the switch 131 is connected to the ground terminal 1312, and the switch 133 is connected to the terminal 1332.

The residual voltage storing circuit 2B includes a capacitance element 142. A terminal 1413 of the capacitance element 142 arranged on one end side is connected to be switchable to a terminal 1411 or a ground terminal 1412 by using a switch 141. A terminal 1431 of the capacitance element 142 arranged on the other end side is connected to be switchable to a terminal 1432 or a ground terminal 1433 by using a switch 143. The terminal 1432 is connected to a signal line 42.

When a residual voltage is sampled, the switch 141 is connected to the terminal 1411, and the switch 143 is connected to the ground terminal 1433. On the other hand, when a residual voltage stored in the residual voltage storing circuit 2B is output, the switch 141 is connected to the ground terminal 1412, and the switch 143 is connected to the terminal 1432.

The switching operations performed by the switches 131, 133, 141, and 143 are controlled respectively based on control signals $\phi$A1, $\phi$A2, $\phi$B1, and $\phi$B2 supplied from the SAR logic circuit 12.

The residual voltage feedback unit 1 includes a selection circuit 4. The selection circuit 4 selects one of outputs of the residual voltage storing circuits 2A and 2B of the residual voltage storing unit 2 supplied via buffers 151 and 152, and supplies the selected output to a residual voltage adding unit 3 via a signal line 50. The residual voltage adding unit 3 includes a switch 161 and a capacitance element 162. The switch 161 performs switching between the terminal 1612 to which the signal line 50 is connected and the ground terminal 1611 to be connected to the terminal 1613 in response to the control signal $\phi$NS. The control signal $\phi$NS is supplied from the SAR logic circuit 12.

The SAR-ADC operates such that a voltage applied to the comparison circuit 11 via the signal line 20 is equal to the ground electric potential in each cycle in which the input voltage Vin is converted into the digital signal Dout. However, actually, when each conversion cycle ends, the voltage of the signal line 20 is not equal to the ground electric potential, a conversion error occurs, and a residual voltage is present.

In the present embodiment, the residual voltage feedback unit 1 that feeds back the residual voltage to the signal line 20 is included in the SAR_ADC. The residual voltage feedback unit 1 includes: switches 131 and 141 that supply a residual voltage to the capacitance elements 132 and 142 configuring the residual voltage storing unit 2 of the residual voltage feedback unit 1 at predetermined timing; and switches 133 and 143 that output a residual voltage stored in the capacitance elements 132 and 142 to the residual voltage adding unit 3 at predetermined timing. By controlling the switches 131 and 141, the timing at which the residual voltage is supplied to the residual voltage storing unit 2, in other words, timing at which the residual voltage is sampled can be adjusted. In addition, by controlling the switches 133 and 143, a residual voltage stored in the capacitance elements 132 and 142 can be added to the signal line 20 at arbitrary timing. For example, in a next cycle of the cycle in which the residual voltage is stored, in other words, by delaying the residual voltage by one cycle, the residual voltage can be added to the signal line 20 via the residual voltage adding unit 3. In this way, noise shaping of a first order can be performed.

The residual voltage is added to the signal line 20 to which the CDAC 10 is connected, via the capacitance element 162 of the residual voltage adding unit 3. Accordingly, by appropriately selecting the capacity of the capacitance element 162 of the residual voltage adding unit 3 with respect to total capacity of the CDAC 10, the residual voltage can be added to the voltage of the signal line 20 to which the CDAC 10 is connected at a desired ratio. For example, in a case where the capacitance $C_{FB}$ of the capacitance element 162 of the residual voltage adding unit 3 is set to be twice as large as a total capacitance C of the CDAC 10, based on the principle of electric charge redistribution, the residual voltage can be added to the voltage of the signal line 20 at the ratio of two to one. The capacitance elements 101 to 104 of the CDAC 10 and the capacitance element 162 of the residual voltage adding unit 3, for example, can be configured with high accuracy using wiring capacitance between wires in a semiconductor device (not illustrated in the drawing). As a result, the stored residual voltage can be added to the voltage of the signal line 20 with high accuracy based on the capacitance ratio described above.

According to the present embodiment, the residual voltage can be stored in the residual voltage storing unit 2 with being delayed by an arbitrary time, and the stored residual voltage can be added to the signal line 20 at a desired ratio in accordance with the ratio of the total capacitance of the CDAC 10 to the capacitance of the capacitance element 162 of the residual voltage adding unit 3.

The digital signal Dout can be represented using the following Equation (1).

$$Dout = Vin + Q_{SAR}(1 - \alpha \times Z^{-1}) \quad (1)$$

Here, $Q_{SAR}$ is a residual voltage, $\alpha$ is a ratio (the capacitance $C_{FB}$ of the residual voltage adding unit 3/the total capacitance C of the CDAC 10) between the capacitance $C_{FB}$ of the capacitance element 162 of the residual voltage adding unit 3 and the total capacitance C of the CDAC 10, and "$Z^{-1}$" is a transfer function that represents a delay corresponding to one cycle. Equation (1) represents a noise shaping characteristic of a first order. Since the capacitance elements 101 to 104 configuring the CDAC 10 are connected parallel with respect to the signal line 20, the total capacitance C is a total sum of the capacitance values of the capacitance elements 101 to 104.

Figure 2:
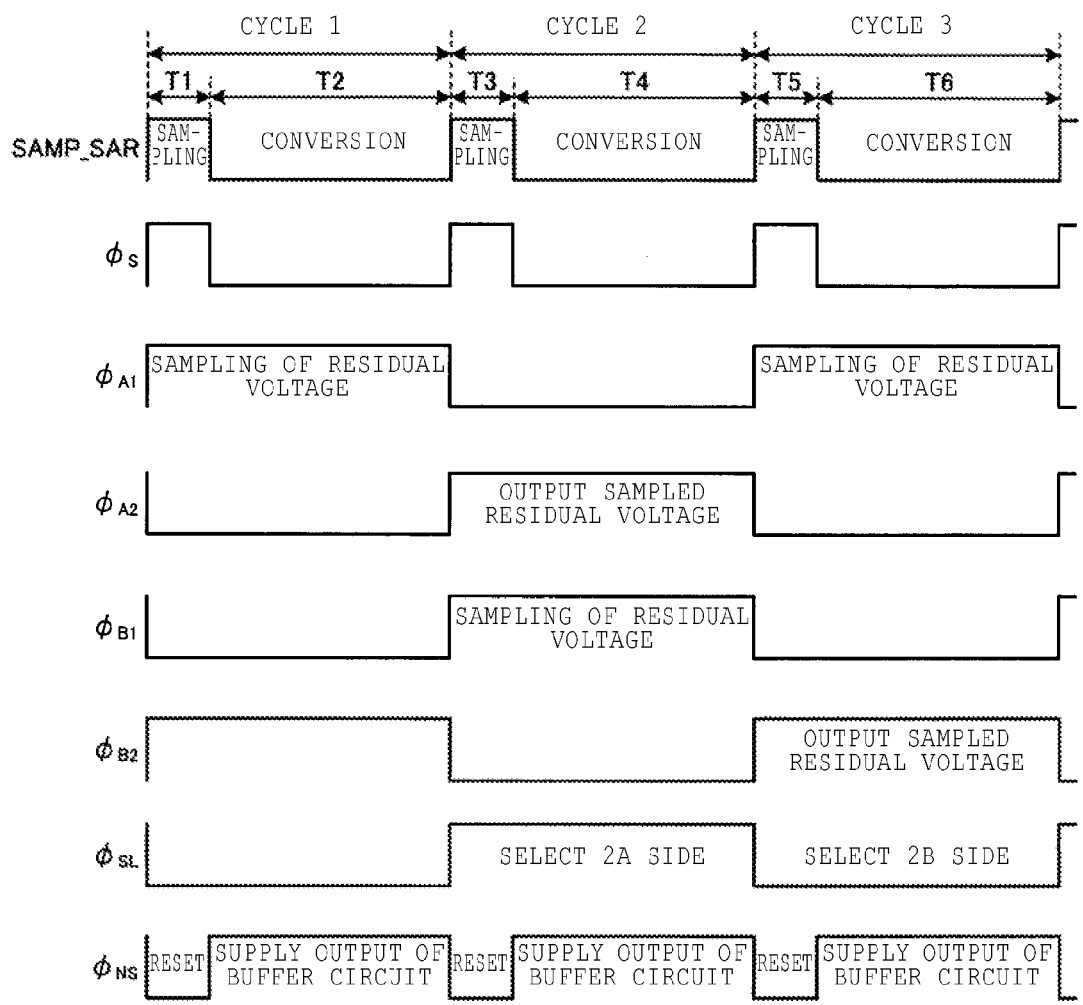
FIG. 2 illustrates an operation of the SAR-ADC according to the first embodiment.

The operation of the SAR-ADC according to the first embodiment will be described with reference to FIG. 2. Cycles (Cycles 1 to 3) represent conversion cycles of successive conversions. In response to a sampling signal SAMP_SAR represented in an upper stage, an input voltage Vin is sampled in a period T1. Next, in a period T2, an AD conversion is performed. For example, an operation of successive comparisons of the input voltage Vin with the reference voltage Vref is performed using a binary search algorithm, and a digital signal Dout is output. In the sampling operation period T1 of the input voltage Vin, the switch 17 is in the On state in accordance with a control signal φs, and the signal line 20 is grounded.

In response to a control signal φA1, a conversion error of Cycle 1, in other words, a residual voltage is sampled. At this time, the switch 131 of the residual voltage storing circuit 2A of the residual voltage storing unit 2 is connected to the terminal 1311. In response to a control signal φA2, the switch 133 is connected to the ground terminal 1333. The residual voltage of the signal line 20 is stored in the capacitance element 132 of the residual voltage storing circuit 2A as electric charge.

In the next Cycle 2, similarly, sampling of the input voltage Vin and the AD conversion operation are performed. In a period T3, the input voltage Vin is sampled, and an AD conversion is performed in a period T4. In Cycle 2, a residual voltage sampled in the previous Cycle 1, in other words, a residual voltage stored in the residual voltage storing circuit 2A is output to the residual voltage adding unit 3. In response to a control signal φA1, the switch 131 is connected to the ground terminal 1312. In response to a control signal φA2, the switch 133 is connected to the terminal 1332. In response to a control signal φSL, the selector 153 selects the residual voltage storing circuit 2A and connects the residual voltage storing circuit 2A to the terminal 1612 of the residual voltage adding unit 3.

In Cycle 2, in response to a control signal φB1, the switch 141 connects the terminal 1411 and the terminal 1413, and the residual voltage is stored in the residual voltage storing circuit 2B. In response to a control signal φB2, the switch 143 connects the terminal 1431 to the ground terminal 1433.

In response to a control signal φNS, the switch 161 of the residual voltage adding unit 3 is connected to the ground terminal 1611 in a sampling period T3 of the input voltage Vin of Cycle 2. As a result, the storage state of the residual voltage adding unit 3 is reset. Thereafter, under the control of a control signal φNS, the switch 161 is connected to the terminal 1612. As a result, the selection circuit 4 selects the output of the residual voltage storing circuit 2A and supplies the selected output to the residual voltage adding unit 3. In accordance with a ratio of the capacitance CFB of the capacitance element 162 of the residual voltage adding unit 3 to the total capacitance C of the CDAC 10, the residual voltage is added to the voltage of the signal line 20.

A residual voltage stored in the residual voltage storing circuit 2A is a residual voltage of Cycle 1 and has timing delayed by one cycle so as to be added to the output of the CDAC 10 in Cycle 2.

In Cycle 3, in response to a control signal φB2, the switch 143 connects the terminal 1431 of the residual voltage storing circuit 2B to the terminal 1432. As a result, the residual voltage stored by the residual voltage storing circuit 2B is output. In response to a control signal φSL, the selector 153 selects the residual voltage storing circuit 2B and connects the residual voltage storing circuit 2B to the terminal 1612 of the residual voltage adding unit 3. A residual voltage stored in the residual voltage storing circuit 2B is a residual voltage of Cycle 2 and has timing delayed by one cycle so as to be added to the output of the CDAC 10 in Cycle 3.

The residual voltage delayed by one cycle is supplied from the residual voltage storing circuit 2A or 2B to the residual voltage adding unit 3. As a result, by adding the output of the residual voltage adding unit 3 to the output of the CDAC 10, a noise shaping characteristic of a first order can be acquired.

By controlling timing at which the residual voltage is output to the residual voltage adding unit 3 through the switches 133 and 143 of the residual voltage storing unit 2, for example, the residual voltage may be supplied with being delayed by two cycles to the residual voltage adding unit 3.

Second Embodiment

Figure 3:
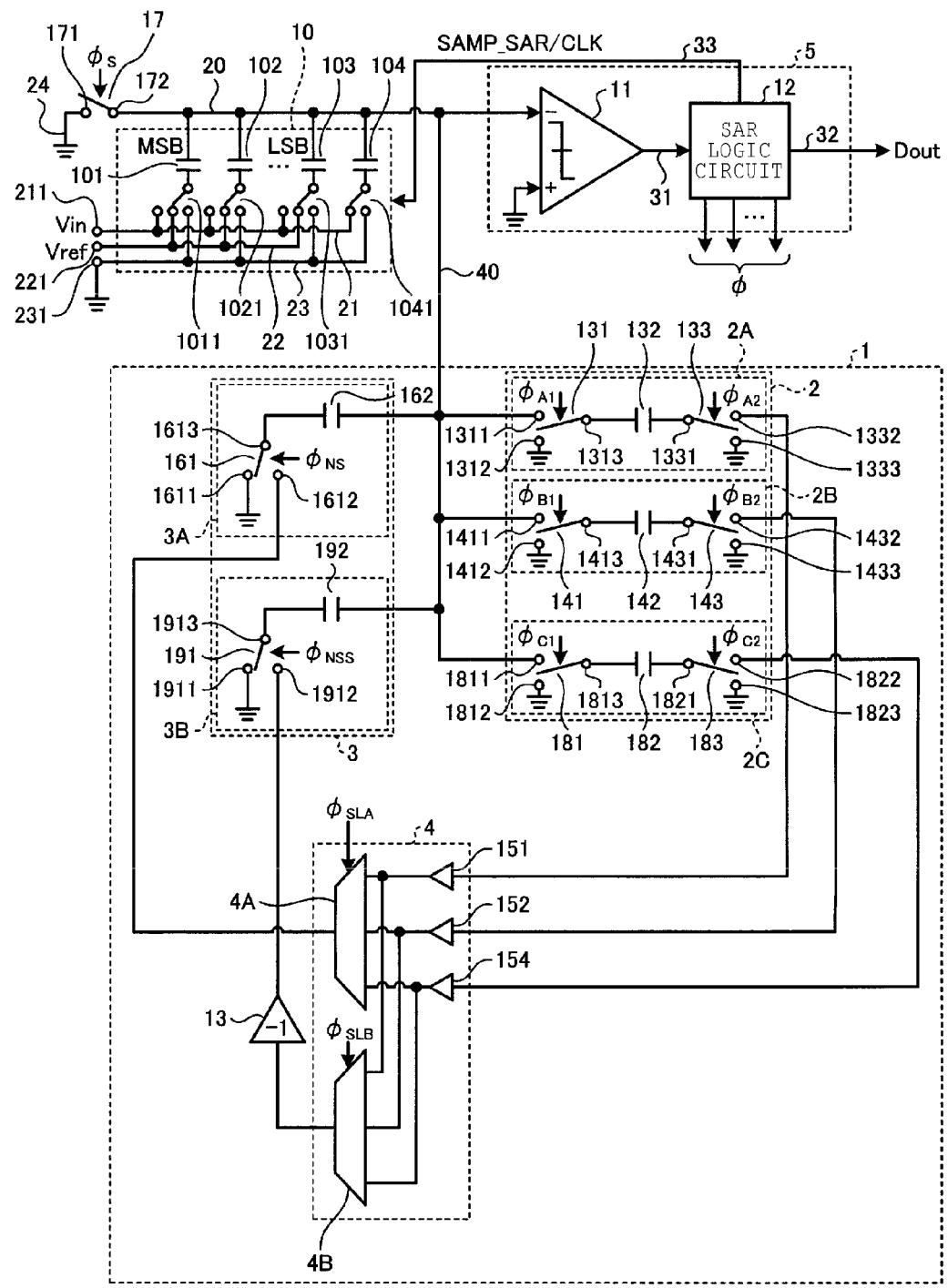
FIG. 3 illustrates a configuration of a SAR-ADC according to a second embodiment.

FIG. 3 illustrates a configuration of a SAR-ADC according to a second embodiment. A same reference numeral is assigned to an element corresponding to the embodiment described above, and duplicate description will not be presented unless necessary. The same will be applied to embodiments hereinafter. A residual voltage storing unit 2 according to the present embodiment includes a residual voltage storing circuit 2C. The residual voltage storing circuit 2C includes a switch 181. In response to a control signal φC1, the switch 181 switches a terminal 1813 of a capacitance element 182 arranged on one end to one of a terminal 1811 and a ground terminal 1812. A switch 183 is connected to a terminal 1821 of the capacitance element 182 arranged on the other end. In response to a control signal φC2, the switch 183 switches a connection destination of the terminal 1821 to one of a terminal 1822 and a ground terminal 1823.

Output terminals 1332, 1432, and 1822 of residual voltage storing circuits 2A, 2B, and 2C are connected to selectors 4A and 4B via buffers 151, 152, and 154 of a selection circuit 4. In response to a control signals φSLA or φSLB, each of the selectors 4A and 4B selects one of outputs of the residual voltage storing circuits 2A, 2B, and 2C and supplies the selected output to a residual voltage adding circuit 3A or 3B of a residual voltage adding unit 3. The output of the selector 4B is supplied to a residual voltage adding circuit 3B via an inverting amplifier 13. The output of the residual voltage storing unit 2 can be supplied to the residual voltage adding circuit 3B with the polarity inverted through the inverting amplifier 13. The residual voltage adding circuit 3A corresponds to the configuration of the residual voltage adding unit 3 according to the embodiment illustrated in FIG. 1. In contrast, in the present embodiment, the residual voltage adding unit 3 includes the two residual voltage adding circuits 3A and 3B, and thus reference numeral 3A is assigned thereto so as to be distinguished from the residual voltage adding unit 3.

In response to a control signal φNS, a switch 161 of the residual voltage adding circuit 3A of the residual voltage adding unit 3 switches the connection destination of a terminal 1613 to one of a ground terminal 1611 and a terminal 1612 to which the selector 4A is connected. In response to a control signal φNSS, a switch 191 of the residual voltage adding circuit 3B switches the connection destination of a terminal 1913 to one of a ground terminal 1911 and a terminal 1912 to which the selector 4B is connected.

A capacitance element 162 of the residual voltage adding circuit 3A is specified and the selector 4A supplies an output thereto. As a result, by selecting a residual voltage delayed by one cycle, supplying the selected residual voltage to the residual voltage adding circuit 3A, and adding the residual voltage via the capacitance element 162 of the residual voltage adding circuit 3A, the residual voltage delayed by one cycle can be added to the voltage of the signal line 20.

Similarly, a capacitance element 192 of the residual voltage adding circuit 3B is specified and the selector 4B supplies an output thereto. By selectively supplying a residual voltage delayed by two cycles to the residual voltage adding circuit 3B, the residual voltage delayed by two cycles can be added to the voltage of the signal line 20. Since the residual voltage of the residual voltage adding unit 3 can be added to the output voltage of the residual voltage CDAC 10 of the residual voltage adding unit 3 in accordance with the ratio of the capacitance of the capacitance element 162 or 192 of the residual voltage adding circuit 3A or 3B to the total capacitance C of the CDAC 10, for example, a SAR-ADC having a noise shaping characteristic of a second order can be configured.

The shaping characteristic of the second order can be represented using Equation (2).

$$Dout = Vin + Q_{SAR} \times (1-Z^{-1})^2 = Vin + Q_{SAR} \times (1-2\times Z^{-1}+Z^{-2}) \quad (2)$$

Here, $Z^{-2}$ is a transfer function that represents a delay corresponding to two cycles.

For example, a residual voltage acquired by setting the capacitance of the capacitance element 162 of the residual voltage adding circuit 3A to be twice the total capacitance C of the CDAC 10 and to be delayed by one cycle is supplied and added to the residual voltage adding circuit 3A. Also, a residual voltage acquired by setting the capacitance of the capacitance element 192 of the residual voltage adding circuit 3B set to be a same value as the total capacitance C of the CDAC 10 and to be delayed by two cycles is supplied to the residual voltage adding circuit 3B and added to the voltage of the signal line 20. As a result, a characteristic satisfying Equation (2), in other words, a noise shaping characteristic of a second order can be acquired. By supplying the output of the selector 4B to the residual voltage adding circuit 3B via the inverting amplifier 13, the polarity can be inverted.

By adjusting the number of the residual voltage storing circuits 2A, 2B, and 2C of the residual voltage storing unit 2 and the residual voltage adding circuits 3A and 3B of the residual voltage adding unit 3 and the polarity using the inverting amplifier 13 and adding the residual voltage delayed by a predetermined number of cycles to the voltage of the signal line 20 to which the output voltage of the CDAC 10 is supplied at a predetermined capacitance ratio, a noise shaping of a desired high order can be acquired.

In the present embodiment, the outputs of the residual voltage storing circuits 2A, 2B, and 2C of the residual voltage storing unit 2 storing residual voltages stored at predetermined timings are supplied to one of a plurality of the capacitance elements 162 and 192 of the residual voltage adding unit 3 that is appropriately selected. In other words, one of the capacitance elements 162 and 192 of the residual voltage adding unit 3 is specified in accordance with a delay time from the timing at which the residual voltage is sampled, and the outputs of the plurality of the capacitance elements of the residual voltage storing unit 2 are supplied thereto. By appropriately setting the capacitance of the capacitance elements 162 and 192 of the residual voltage adding unit 3 and the total capacitance C of the CDAC 10, a residual voltage having a predetermined delay time can be added to the voltage of the signal line 20 at a predetermined ratio. As a result, a noise shaping characteristic of a high order can be easily acquired.

Figure 4:
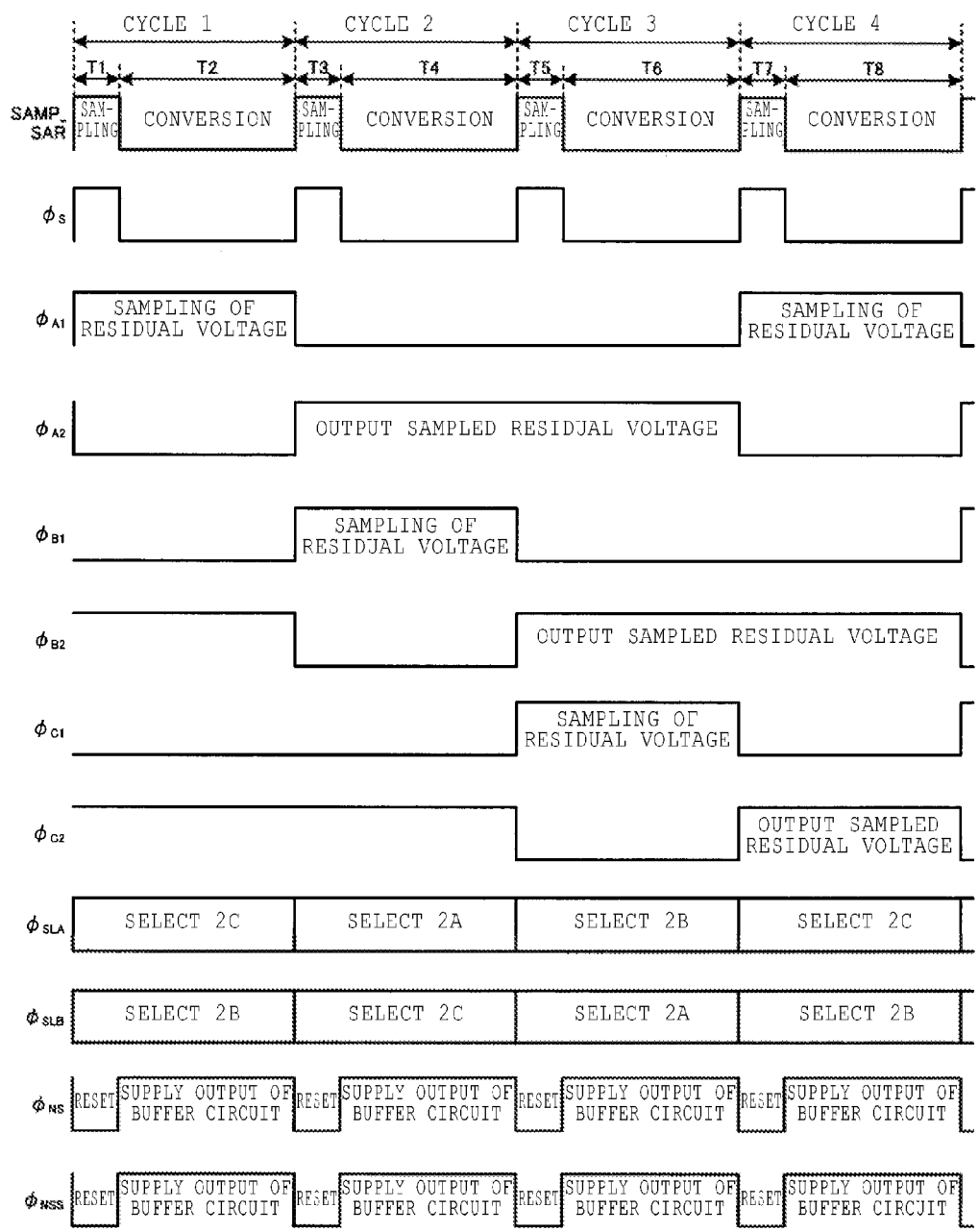
FIG. 4 illustrates an operation of the SAR-ADC according to the second embodiment.

The operation of the SAR-ADC according to the second embodiment will be described with reference to FIG. 4. Each Cycle (Cycles 1 to 4) represents a conversion cycle of successive conversions. In response to a sampling signal SAMP_SAR represented in an upper stage, an input voltage Vin is sampled in a period T1. Next, in a period T2, an AD conversion is performed. For example, an operation of successive comparisons of the input voltage Vin with the reference voltage Vref is performed using a binary search algorithm, and a digital signal Dout is output. In the sampling operation period T1 of the input voltage Vin, the switch 17 is in the On state in accordance with a control signal φs, and the signal line 20 is grounded.

In response to a control signal φA1, a conversion error of Cycle 1 of the conversion cycle, in other words, a residual voltage is sampled. The switch 131 of the residual voltage storing circuit 2A is connected to the terminal 1311. In response to a control signal φA2, the switch 133 is connected to the ground terminal 1333. The residual voltage of the signal line 20 is stored in the capacitance element 132 of the residual voltage storing circuit 2A as electric charge.

In the next Cycle 2, similarly, a conversion operation is performed. In a period T3, the input voltage Vin is sampled, and an AD conversion is performed in a period T4. In Cycle 2, a residual voltage sampled in the previous Cycle 1, in other words, a residual voltage stored in the residual voltage storing circuit 2A is output to the selection circuit 4. In response to a control signal φA1, the switch 131 is connected to the ground terminal 1312. The switch 133 is connected to the terminal 1332.

The terminal 1332 is connected to the selectors 4A and 4B via the buffer 151 of the selection circuit 4. In response to a control signal φSLA, the selector 4A selects the residual voltage storing circuit 2A and connects the residual voltage storing circuit 2A to the terminal 1612 of the residual voltage adding circuit 3A. In Cycle 2, a delay corresponding to one cycle with respect to Cycle 1 occurs. Thus, the residual voltage supplied to the residual voltage adding circuit 3A is a residual voltage delayed by one cycle from the sampling timing, in other words, Cycle 1.

In Cycle 2, in response to a control signal φSLB, the selector 4B selects the output of the residual voltage storing circuit 2C and supplies the selected output to the residual voltage adding circuit 3B. In the residual voltage storing circuit 2C, a residual voltage delayed by two cycles is stored. Thus, by selecting the residual voltage stored in the residual voltage storing circuit 2C and outputting the selected residual voltage to the residual voltage adding circuit 3B, the residual voltage delayed by two cycles can be added to the voltage of the signal line 20 to which the output of the CDAC 10 is supplied.

In the next Cycle 3, similarly, a conversion operation is performed. In a period T5, the input voltage Vin is sampled, and an AD conversion is performed in a period T6. In Cycle 3, in response to a control signal φSLA, the selector 4A selects the output of the residual voltage storing circuit 2B. In the residual voltage storing circuit 2B, the residual voltage in Cycle 2 in which sampling is performed in response to the control signal φB1, in other words, a residual voltage delayed by one cycle is stored. For this reason, by selecting the output of the residual voltage storing circuit 2B in accordance with a control signal φSLA and supplying the selected output to the specified residual voltage adding circuit 3A, the residual voltage delayed by one cycle is supplied to the residual voltage adding circuit 3A. By using the output of the residual voltage adding circuit 3A, the residual voltage delayed by one cycle can be added to the signal line 20.

In Cycle 3, in response to a control signal φC1, the residual voltage storing circuit 2C stores the residual voltage. In response to a control signal φSLB, the selector 4B selects the output of the residual voltage storing circuit 2A and supplies the selected output to the residual voltage adding circuit 3B. The residual voltage stored in the residual voltage storing circuit 2A is the residual voltage sampled in Cycle 1. Thus, the residual voltage added through the residual voltage adding circuit 3B in Cycle 3 is the residual voltage delayed by two cycles. For this reason, by selecting the output of the residual voltage storing circuit 2A in accordance with the control signal φSLB and supplying the selected output to the specified residual voltage adding circuit 3B, the residual voltage delayed by two cycles is supplied to the residual voltage adding circuit 3B. By using the output of the residual voltage adding circuit 3B, the residual voltage delayed by two cycles can be added to the voltage of the signal line 20.

In Cycle 3, the residual voltage delayed by one cycle is added via the residual voltage adding circuit 3A, and the residual voltage delayed by two cycles is supplied via the residual voltage adding circuit 3B. By appropriately setting the ratio of the capacitance of the capacitance element 162 of the residual voltage adding circuit 3A and the capacitance element 192 of the residual voltage adding circuit 3B to the total capacitance C of the CDAC 10, a noise shaping characteristic of a second order can be acquired.

In the next Cycle 4, similarly, a conversion operation is performed. In a period T7, the input voltage Vin is sampled, and an AD conversion is performed in a period T8. In Cycle 4, in response to a control signal φSLA, the selector 4A selects the output of the residual voltage storing circuit 2C. In the residual voltage storing circuit 2C, the residual voltage in Cycle 3 in which sampling is performed in response to the control signal φB1, in other words, a residual voltage delayed by one cycle is stored. For this reason, by selecting the output of the residual voltage storing circuit 2C in accordance with the control signal φSLA and supplying the selected output to the residual voltage adding circuit 3A, the residual voltage delayed by one cycle can be added to the voltage of the signal line 20 via the residual voltage adding circuit 3A.

In Cycle 4, in response to a control signal φA1, the residual voltage storing circuit 2A stores the residual voltage. In response to a control signal φSLB, the selector 4B selects the output of the residual voltage storing circuit 2B and supplies the selected output to the residual voltage adding circuit 3B. The residual voltage stored in the residual voltage storing circuit 2B is the residual voltage sampled in Cycle 2. As a result, in Cycle 4, the residual voltage delayed by two cycles is added to the voltage of the signal line 20 via the residual voltage adding circuit 3B.

Third Embodiment

Figure 5:
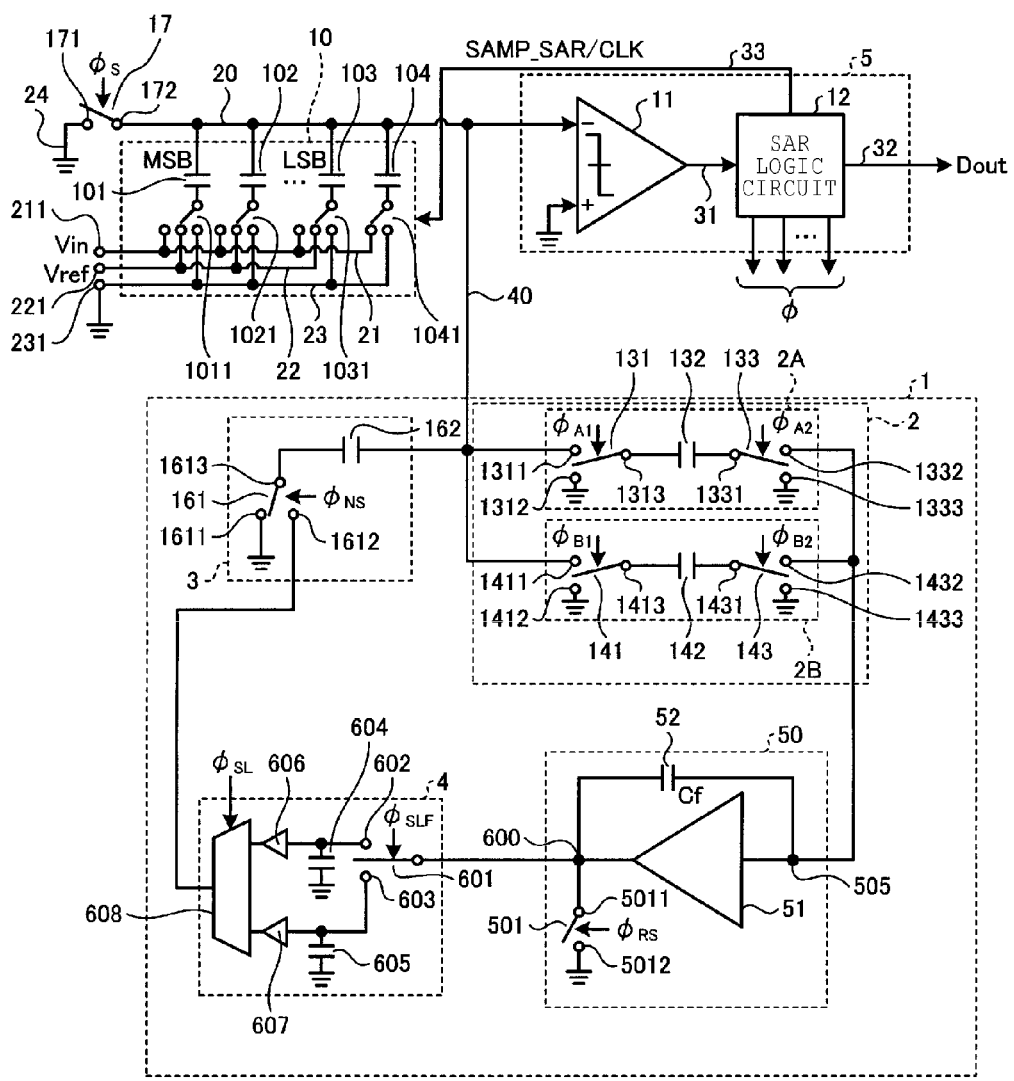
FIG. 5 illustrates a configuration of a SAR-ADC according to a third embodiment.

FIG. 5 illustrates a configuration of a SAR-ADC according to a third embodiment. In the third embodiment, with respect to the first embodiment illustrated in FIG. 1, an amplification circuit 50 that amplifies the output of a residual voltage storing unit 2 is added.

The amplification circuit 50 includes an operational amplifier 51. The output of the residual voltage storing unit 2 is supplied to an input port 505 of the operational amplifier 51. The output of the operational amplifier 51 is supplied to an output port 600. A capacitance element 52 is connected between the input port 505 and the output port 600. A switch 501 is arranged between a terminal 5011 to which the output port 600 is connected and a ground terminal 5012. The switch 501 operates in response to a control signal φRS. As the switch 501 is turned on and the terminal 5011 is connected to the ground terminal 5012, the output of the amplification circuit 50 is reset.

A connection destination of the output port 600 of the amplification circuit 50 is switched between the terminal 602 and the terminal 603 by the switch 601. One end of a capacitance element 604 is connected to the terminal 602, and the other end of the capacitance element 604 is grounded. The capacitance element 604 stores a residual voltage supplied via the terminal 602 as electric charge.

One end of a capacitance element 605 is connected to the terminal 603, and the other end of the capacitance element 605 is grounded. The capacitance element 605 stores a residual voltage supplied via the terminal 603 as electric charge.

The residual voltage stored in the capacitance element 604 is supplied to a selector 608 via a buffer 606. The residual voltage stored in the capacitance element 605 is supplied to the selector 608 via a buffer 607. In response to a control signal φSL, the selector 608 selects one of the output supplied from the buffer 606 and the output supplied from the buffer 607, and supplies the selected output to a residual voltage adding unit 3.

In the present embodiment, the amplification circuit 50 is included. For this reason, residual voltages stored in residual voltage storing circuits 2A and 2B of the residual voltage storing unit 2 can be amplified and be supplied to the residual voltage adding unit 3. As a result, also in a case where the residual voltage is attenuated in the residual voltage storing unit 2, the attenuated residual voltage can be recovered and be supplied to the residual voltage adding unit 3. The amplification factor of the amplification circuit 50 can be set, for example, by using a ratio between the capacitance Cf of the capacitance element 52 and the capacitance of capacitance elements 132 and 142 of the residual voltage storing circuits 2A and 2B. In a case where the capacitance of the capacitance elements 132 and 142 of the residual voltage storing circuits 2A and 2B is denoted by CRES, the amplification factor A of the amplification circuit 50 is set to CRES/Cf.

Figure 6:
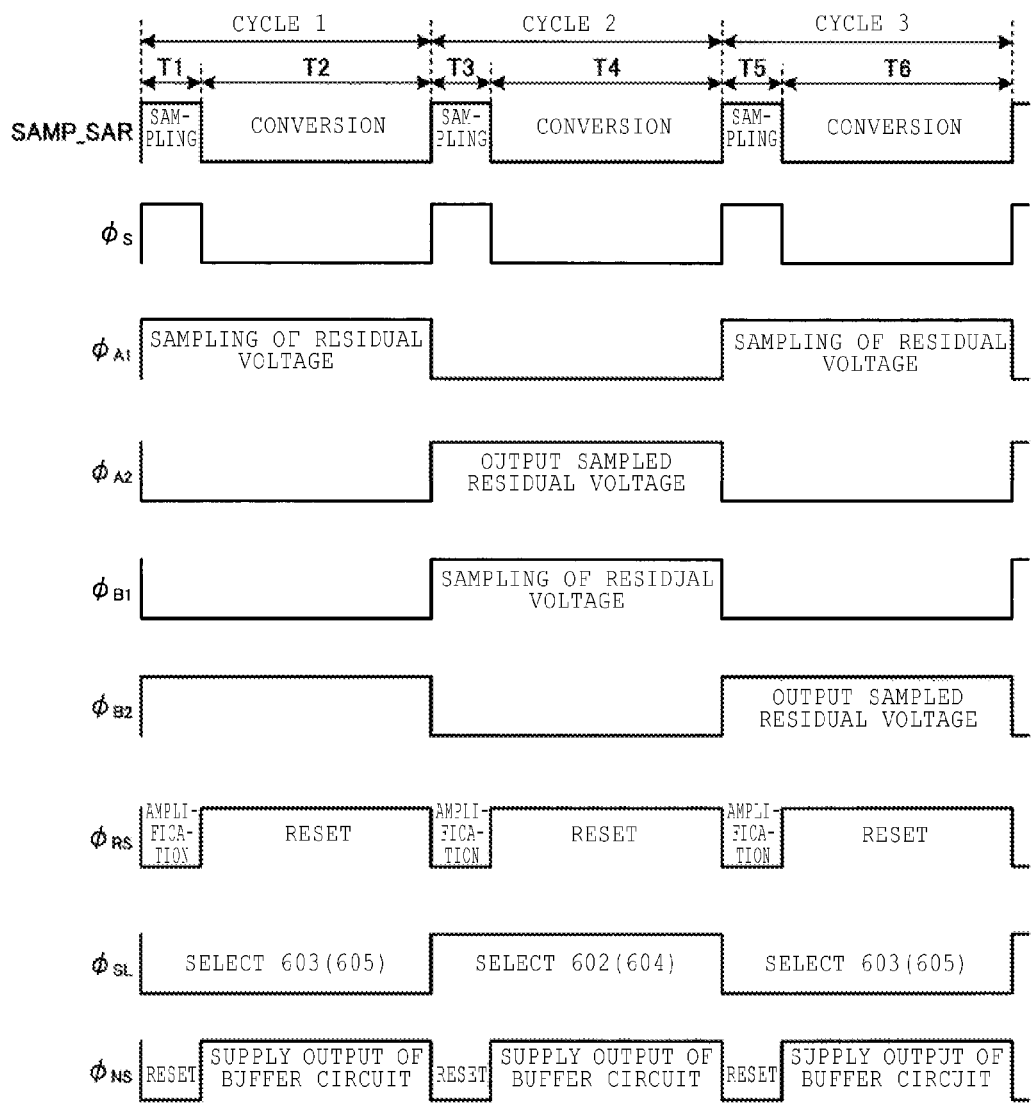
FIG. 6 illustrates an operation of the SAR-ADC according to the third embodiment.

FIG. 6 illustrates an operation of the SAR-ADC according to the third embodiment. In each of cycles (Cycles 1 to 3), an AD conversion is performed. In a period T1 of Cycle 1, an input voltage Vin is sampled. In a period T2, an AD conversion is performed. In Cycle 1, in response to a control signal φA1, a residual voltage is sampled and is stored in the residual voltage storing circuit 2A.

In Cycle 2, the residual voltage stored in the residual voltage storing circuit 2A is output and supplied to the amplification circuit 50. In addition, in Cycle 2, in response to a control signal φB1, a residual voltage is sampled and supplied to the residual voltage storing circuit 2B.

In Cycle 2, in response to a control signal φSLF, the switch 601 supplies the output voltage of the amplification circuit 50 to the terminal 602. The output voltage of the amplification circuit 50 is stored in the capacitance element 604 that is connected to the terminal 602. The voltage stored in the capacitance element 604 is supplied to the selector 608 via the buffer 606. In response to a control signal φSL, the selector 608 selects the terminal 602 (the capacitance element 604 side), and the supplied voltage is supplied to the residual voltage adding unit 3. In response to this control signal φRS, the switch 501 connects the terminal 5011 to the ground terminal 5012, whereby the output of the amplification circuit 50 is reset.

In Cycle 2, since the residual voltage sampled in Cycle 1 is stored in the residual voltage storing circuit 2A, by selecting the output of the residual voltage storing circuit 2A and supplying the selected output to the residual voltage adding unit 3 in Cycle 2, a residual voltage delayed by one cycle can be amplified by the amplification circuit 50 and be added.

In Cycle 3, the residual voltage stored in the residual voltage storing circuit 2B is output in response to a control signal φB2. In response to a control signal φSL, by selecting the output of the residual voltage storing circuit 2B and supplying the selected output to the residual voltage adding unit 3 by using the selector 608, a residual voltage delayed by one cycle can be amplified by the amplification circuit 50 and added.

By amplifying the residual voltage stored by the residual voltage storing unit 2 and supplying the amplified residual voltage to the residual voltage adding unit 3, also in a case where the residual voltage is attenuated in the residual voltage storing unit 2, the attenuated residual voltage can be recovered and supplied to the residual voltage adding unit 3. By grounding the output port 600 of the amplification circuit 50 by using the switch 501 responding to the control signal φRS, the residual voltage supplied to the residual voltage adding unit 3 can be reset for each cycle.

Fourth Embodiment

Figure 7:
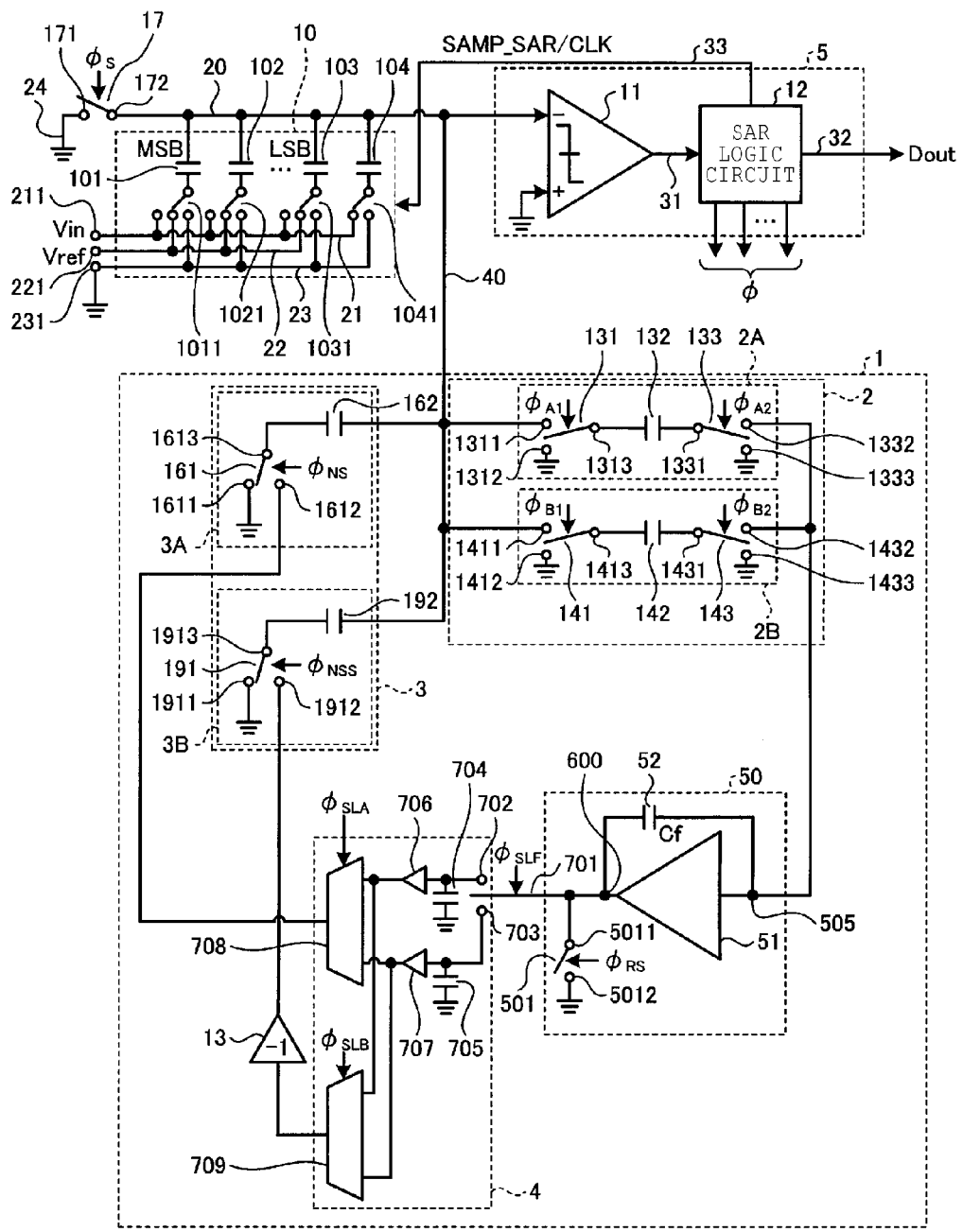
FIG. 7 illustrates a configuration of a SAR-ADC according to a fourth embodiment.

FIG. 7 illustrates a configuration of a SAR-ADC according to a fourth embodiment. In the fourth embodiment, a selection circuit 4 that is connected to an output port 600 of an amplification circuit 50 via a switch 701 is included. The switch 701 switches the connection destination of the output port 600 to one of terminals 702 and 703 in response to a control signal φSLF.

A capacitance element 704 is connected to the terminal 702, and a capacitance element 705 is connected to the terminal 703. A buffer 706 is connected to the terminal 702, and a buffer 707 is connected to the terminal 703. The outputs of the buffers 706 and 707 are connected to selectors 708 and 709. In response to a control signal φSLA, the selector 708 selects one of the output of the buffer 706 and the output of the buffer 707 and outputs the selected output. In response to a control signal φSLB, the selector 709 selects one of the output of the buffer 706 and the output of the buffer 707, and outputs the selected output.

The output of the selector 708 is supplied to a residual voltage adding circuit 3A, and the output of the selector 709 is supplied to a residual voltage adding circuit 3B via an inverting amplifier 13.

In the present embodiment, the amplification circuit 50 that amplifies the output of the residual voltage storing unit 2 and supplies the amplified output to the residual voltage adding circuits 3A and 3B is included in the SAR-ADC. For that reason, also in a case where there is attenuation in the residual voltage storing unit 2, the attenuated residual voltage can be recovered and be supplied to the residual voltage adding circuits 3A and 3B.

In the present embodiment, a residual voltage adding unit 3 includes a plurality of residual voltage adding circuits 3A and 3B respectively including capacitance elements 162 and 192. By adjusting the sampling timing of residual voltages in the residual voltage storing circuits 2A and 2B and selectively supplying the outputs of the residual voltage storing circuits 2A and 2B to the residual voltage adding circuits 3A and 3B, for example, it may be configured such that a residual voltage delayed by one cycle is supplied to the residual voltage adding circuit 3A, and that a residual voltage delayed by two cycles is supplied to the residual voltage adding circuit 3B. The outputs of the residual voltage adding circuits 3A and 3B can be added to the output voltage of the CDAC 10 at an arbitrary ratio with high accuracy in accordance with the ratio of the capacitance of the capacitance elements 162 and 192 of the residual voltage adding circuits 3A and 3B to the total capacitance C of the CDAC 10. As a result, a SAR-ADC having a noise shaping characteristic of a high order can be easily configured.

Figure 8:
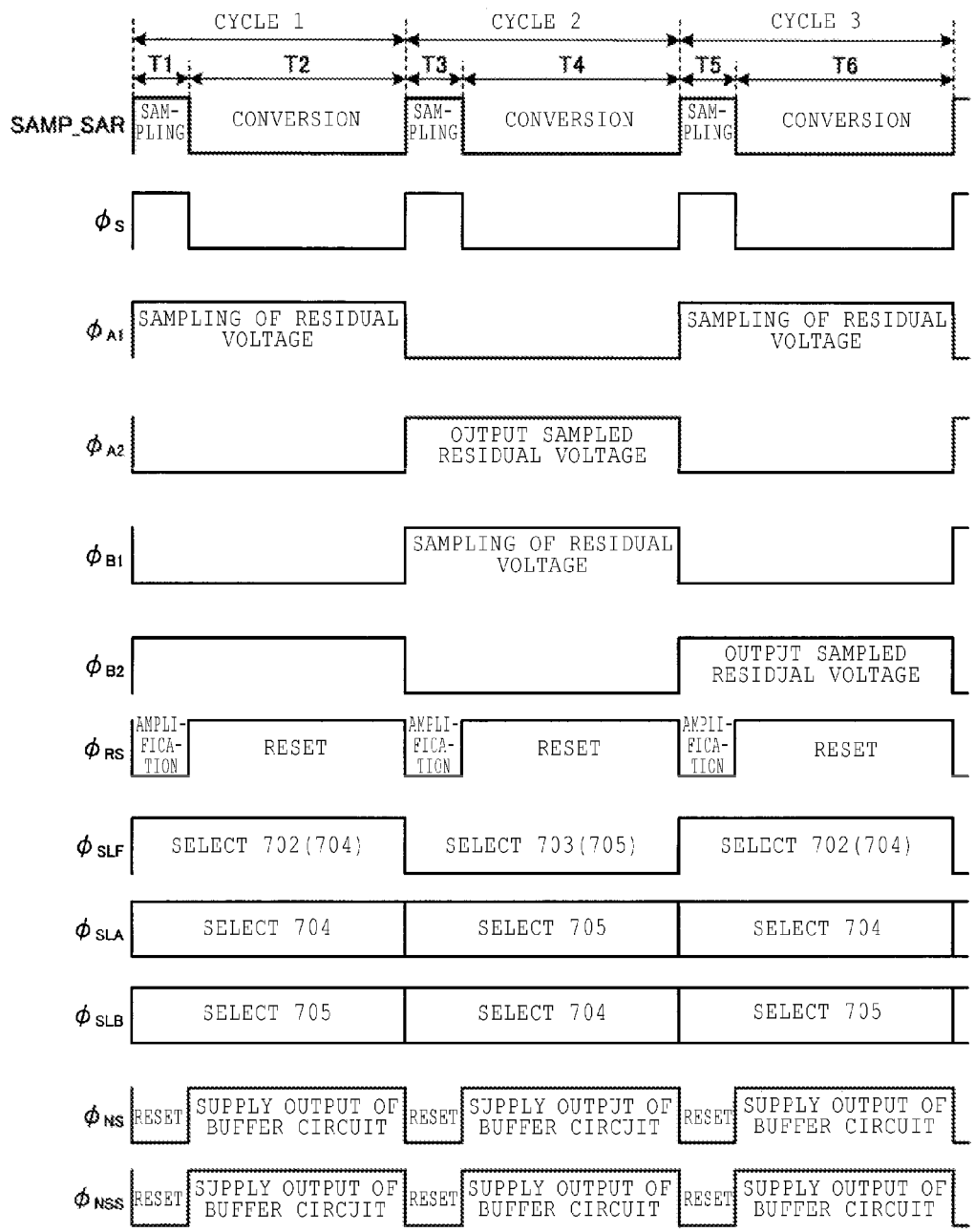
FIG. 8 illustrates an operation of the SAR-ADC according to the fourth embodiment.

The operation of the SAR-ADC according to the fourth embodiment will be described with reference to FIG. 8. In Cycle 1, in response to a control signal φA1, a residual voltage is sampled and supplied to the residual voltage storing circuit 2A.

In Cycle 2, a residual voltage stored in the residual voltage storing circuit 2A is amplified by the amplification circuit 50, and the amplified residual voltage is output. In response to a control signal φSLF, the switch 701 is connected to the terminal 703, and the output is stored in the capacitance element 705. In other words, the residual voltage delayed by one cycle is stored in the capacitance element 705. In response to a control signal φSLA, the selector 708 selects the capacitance element 705 and supplies the stored residual voltage delayed by one cycle to the capacitance element 162, whereby the residual voltage delayed by one cycle is added to the output of the CDAC 10 by the residual voltage adding circuit 3A.

In Cycle 3, the capacitance element 705 is in a state in which the residual voltage delayed by two cycles from Cycle 1 in which sampling is performed is stored. For that reason, in response to a control signal φSLB, by selecting the capacitance element 705 side by using the selector 709 and supplying the voltage stored in the capacitance element 192 of the residual voltage adding circuit 3B, the residual voltage delayed by two cycles can be added to the output of the CDAC 10 via the residual voltage adding circuit 3B.

In the present embodiment, the residual voltage adding unit 3 including the capacitance elements 162 and 192 arranged for delay times of the residual voltage is included in the SAR-ADC. Since a residual voltage having a different delay time can be added based on the setting of the ratio of the capacitance of each of the capacitance elements 162 and 192 of the residual voltage adding circuits 3A and 3B of the residual voltage adding unit 3 to the total capacitance C of the CDAC 10, a noise shaping characteristic of a high order can be acquired. In addition, the outputs of the residual voltage storing circuits 2A and 2B are amplified by the amplification circuit 50, and the amplified outputs are supplied to the residual voltage adding unit 3. Thus, also in a case where attenuation of the residual voltage occurs in the residual voltage storing circuit 2A or 2B, the residual voltage can be recovered and be supplied to the residual voltage adding circuit 3.

Fifth Embodiment

Figure 9:
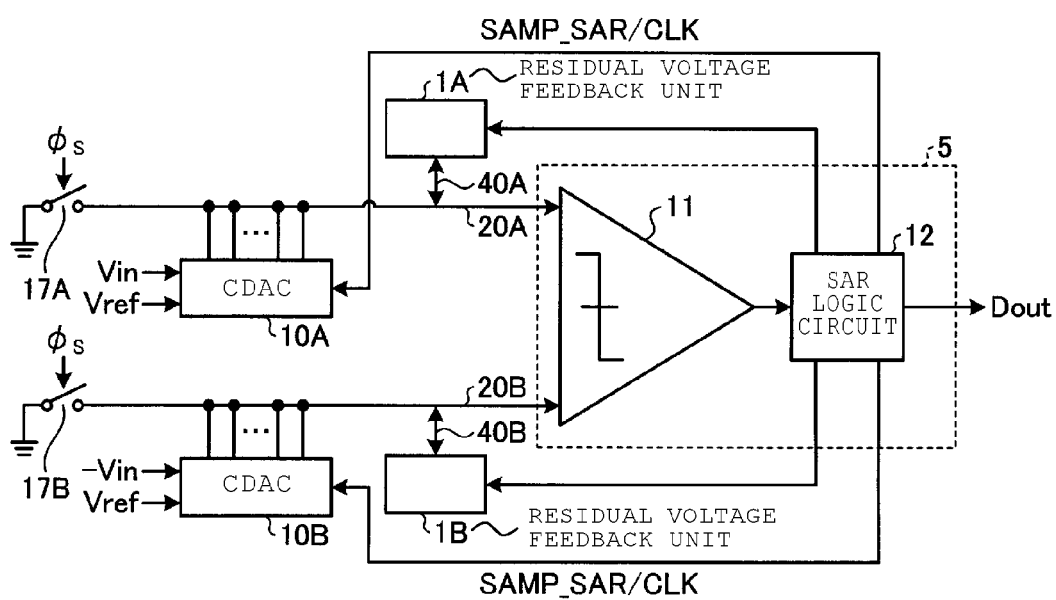
FIG. 9 illustrates a configuration of a SAR-ADC according to a fifth embodiment.

FIG. 9 illustrates a configuration of a SAR-ADC according to a fifth embodiment. In the fifth embodiment, the SAR-ADC has an entire differential configuration. In the present embodiment, a comparison circuit 11 is included in the SAR-ADC. The output of a CDAC 10A is supplied to one input port of the comparison circuit 11 via a signal line 20A. The output of a CDAC 10B is supplied to the other input port of the comparison circuit 11 via a signal line 20B. Each of the CDACs 10A and 10B have the same configuration as that of the CDAC 10 described above.

A residual voltage feedback unit 1A is connected to the signal line 20A via a signal line 40A. A residual voltage feedback unit 1B is connected to the signal line 20B via a signal line 40B. As each of the residual voltage feedback units 1A and 1B, the residual voltage feedback unit 1 having one of the configurations described above may be used. When an input voltage Vin supplied to one CDAC 10A and an input voltage (-Vin) supplied to the other CDAC 10B have a symmetrical value, based on the symmetry of the circuit, an entire differential configuration may be employed.

According to the present embodiment, in the SAR-ADC having the entire differential configuration, by adding the residual voltages delayed by predetermined cycles by the residual voltage feedback units 1A and 1B having the configuration described above to the voltages of the signal lines 20A and 20B, a desired noise shaping characteristic can be configured.

Sixth Embodiment

Figure 10:
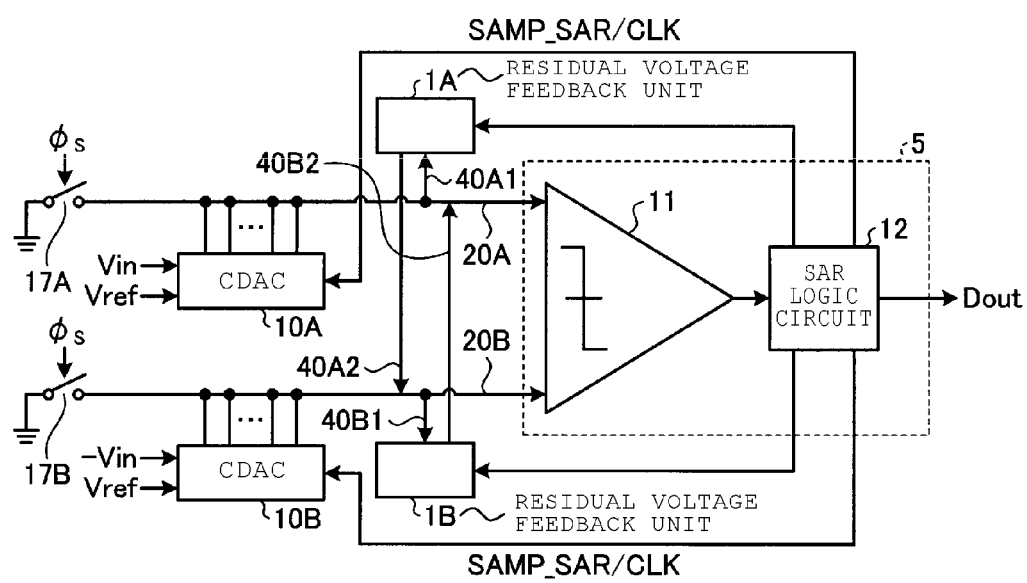
FIG. 10 illustrates a configuration of a SAR-ADC according to a sixth embodiment.

FIG. 10 illustrates a configuration of a SAR-ADC according to a sixth embodiment. In the sixth embodiment, the SAR-ADC has the entire differential configuration, and has a configuration in which the residual voltage of one of signal lines 20A and 20B is stored by a corresponding residual voltage feedback unit 1A or 1B, and a residual voltage stored in the other signal line 20A or 20B is fed back and added after a predetermined delay time. In other words, the output of the residual voltage feedback unit 1A that received a residual voltage from the signal line 20A via the signal line 40A1 is supplied to the signal line 20B connected to the other input port of the comparison circuit 11 via the signal line 40A2. Similarly, the output of the residual voltage feedback unit 1B that received a residual voltage from the signal line 20B via the signal line 40B1 is supplied to the signal line 20A connected to one input port of the comparison circuit 11 via the signal line 40B2.

A residual voltage adding unit (not illustrated in the drawing) of the residual voltage feedback unit 1A is connected to the signal line 40A2, and a residual voltage adding unit (not illustrated in the drawing) of the residual voltage feedback unit 1B is connected to the signal line 40B2. While each of the residual voltage feedback units 1A and 1B basically has the configuration of the residual voltage feedback unit 1 described above, there is a difference in that the output of the residual voltage adding unit 3 is not connected to the signal line 20A or 20B supplied with the residual voltage but to the other signal line 20A or 20B.

Since the outputs of the residual voltage feedback units 1A and 1B are in an opposite phase relation, by adding the residual voltages having the opposite phase relation to the voltages of the signal lines 20A and 20B to which the outputs of the CDACs 10A and 10B are supplied, a configuration for subtracting voltages can be formed. Thus, the SAR-ADC performing subtraction of residual voltages represented in Equation (1) or Equation (2) described above can be configured.

Seventh Embodiment

Figure 11:
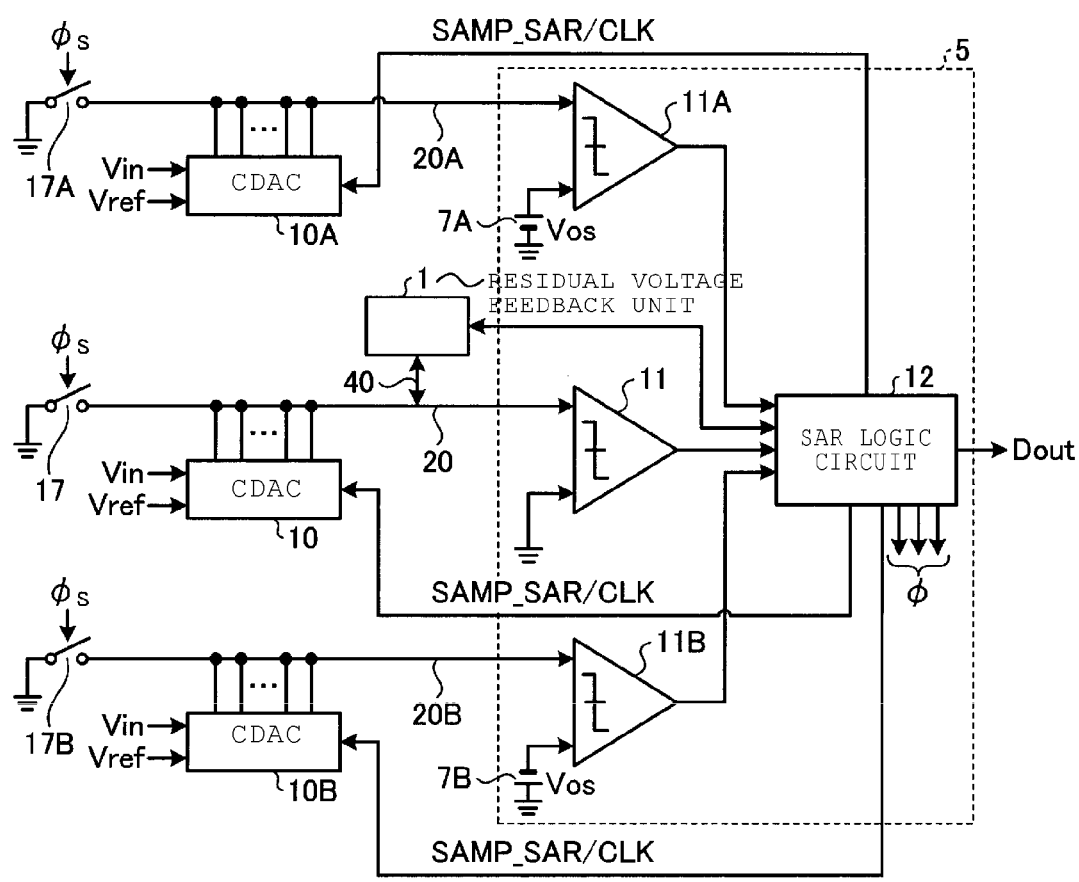
FIG. 11 illustrates a configuration of a SAR-ADC according to a seventh embodiment.

FIG. 11 illustrates a configuration of a SAR-ADC according to a seventh embodiment. In the seventh embodiment, a comparison circuit 11A includes a voltage source 7A that supplies a positive offset voltage Vos as a reference voltage to one input port, and a comparison circuit 11B including a voltage source 7B that supplies a negative offset voltage (-Vos) as a reference voltage to one input port.

The output of a CDAC 10A is supplied to a signal line 20A. The signal line 20A has one end to which a switch 17A is connected and the other end connected to the comparison circuit 11A. The output of the CDAC 10B is supplied to one end of the signal line 20B. The signal line 20B has one end to which a switch 17B is connected and the other end connected to the comparison circuit 11B. The outputs of the comparison circuits 11A and 11B are supplied to a SAR logic circuit 12.

In each conversion cycle, in addition to comparison of the reference voltage Vref with the ground electric potential, comparing operations of comparing the positive offset voltage Vos with the negative offset voltage -Vos are simultaneously performed, and the operations are equivalent to a comparing operation corresponding to two bits. For this reason, since the operations are equivalent to a case where the number of times of comparison in one cycle is increased, an increase in the speed can be achieved by decreasing the number of comparison cycles as a whole.

The residual voltage feedback unit 1 may be connected to an input port of one of the comparison circuits 11A and 11B to which the offset voltages Vos and -Vos are applied in place of the comparison circuit 11 to which the ground electric potential is applied as the reference voltage Vref.

In the present embodiment, by employing a configuration in which AD conversion operations are performed in parallel by using the comparison circuits 11A and 11B to which predetermined offset voltages Vos and -Vos are applied and the SAR logic circuit 12, the number of conversion cycles is decreased, and an increase in the speed can be achieved.

The AD conversion operations performed using the comparison circuits 11A and 11B to which predetermined offset voltages Vos and -Vos are applied may be performed not for all the bits but only for AD conversion cycles of the high-order bit side. By performing a comparison with the offset voltage Vos in parallel in the successive comparison operation of the high-order bit, efficiently the voltage level of the input voltage Vin can be detected in an initial stage. Therefore, an AD conversion operation may be performed in which the power consumption is decreased by causing the operations of the comparison circuits 11A and 11B to which the predetermined offset voltage Vos is applied to be in an Off state for the low-order bit side. Each of the voltage sources 7A and 7B may be configured with a capacitance DAC or a resistor DAC.

Eighth Embodiment

Figure 12:
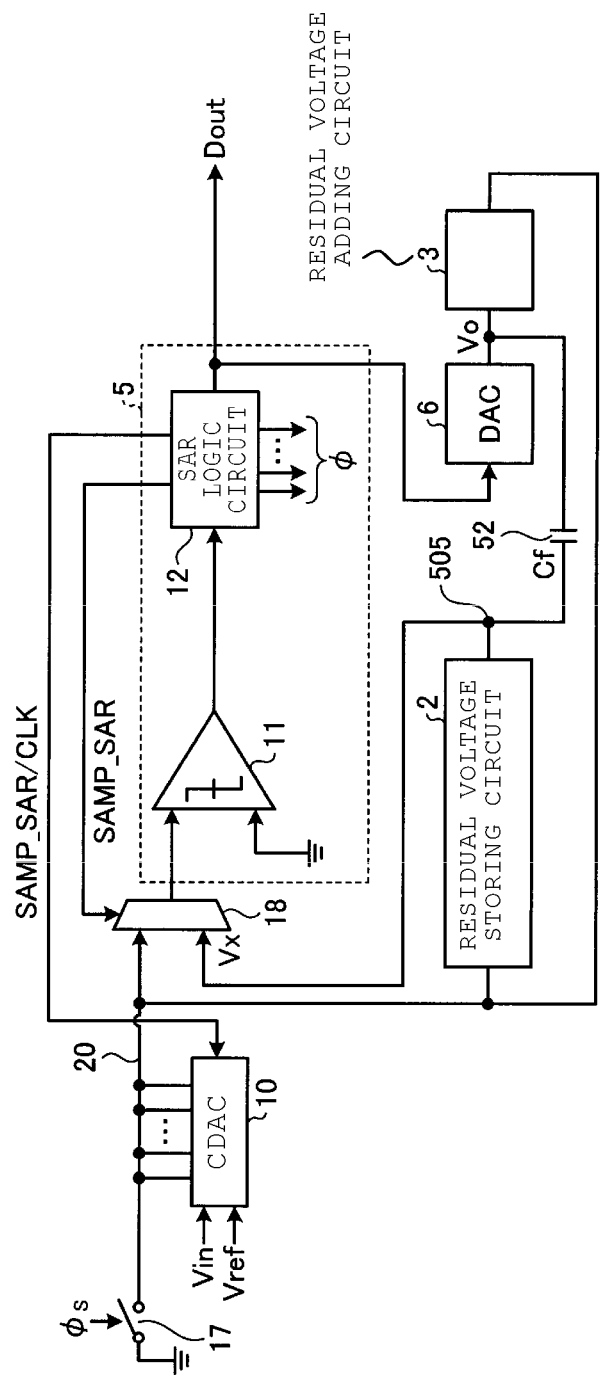
FIG. 12 illustrates a configuration of a SAR-ADC according to an eighth embodiment.

FIG. 12 illustrates a configuration of a SAR-ADC according to an eighth embodiment. In the eighth embodiment, a conversion unit 5 is commonly used in a time-divisional manner as a part of an amplification circuit that amplifies the output voltage of a residual voltage storing unit 2. The output of the residual voltage storing unit 2 is supplied to an output port 505. The output port 505 is connected to a selection circuit 18. The selection circuit 18 selects one of a signal of a signal line 20 and an output of the residual voltage storing unit 2 supplied to the output port 505, and supplies the selected one to a comparison circuit 11 under the control of the SAR logic circuit 12.

In a case where the signal of the signal line 20 is selected by the selection circuit 18, an AD conversion operation using successive comparisons using the comparison circuit 11 and the SAR logic circuit 12 is performed. On the other hand, in a case where the output of the residual voltage storing unit 2 is selected by the selection circuit 18, the output of the residual voltage storing unit 2 is amplified via the conversion unit 5, a DAC (digital-to-analog converter) 6, and a residual voltage adding unit 3 and is output to the signal line 20. In other words, an operation for amplifying the output of the residual voltage storing unit 2 is performed.

In the operation for amplifying the output of the residual voltage storing unit 2, the conversion unit 5 including the comparison circuit 11 and the SAR logic circuit 12 performs quantization of one bit a plurality of cycles, thereby generating a digital code.

The output Vx of the residual voltage storing unit 2 is supplied to one input terminal of the comparison circuit 11 via the selection circuit 18. The other input terminal of the comparison circuit 11 is grounded. The comparison circuit 11 compares the output Vx of the selection circuit 18 with 0 V and outputs a digital value ("0" or "1") according to a result of the comparison. The comparison circuit 11 operates as a quantizer of one bit.

In the operation for amplifying the output of the residual voltage storing unit 2, the comparison of the output Vx of the residual voltage storing unit 2 with 0 V using the comparison circuit 11 is performed a plurality of cycles, and the SAR logic circuit 12 generates a digital code using digital values acquired in the cycles and outputs the generated digital code to the DAC 6. In other words, the successive comparison operation of the SAR-ADC is performed by the SAR logic circuit 12 and the comparison circuit 11.

In the operation of amplifying the output Vx of the residual voltage storing unit 2, the comparison circuit 11 compares the output Vx with the ground electric potential (0 V) and outputs a digital value based on a result of the comparison. For example, the comparison circuit 11 outputs logic "1" in a case where the output Vx is more than 0 V and outputs logic "0" in a case where the output Vx is less than 0 V.

The digital value output by the comparison circuit 11 is stored in the SAR logic circuit 12. The SAR logic circuit 12 updates the digital code D to be input to the DAC 6 based on the stored result of the comparison. The SAR logic circuit 12 updates the digital code D such that the voltage input to the comparison circuit 11 approaches 0 V. More specifically, the SAR logic circuit 12 updates the digital code D such that the digital code decreases in a case where logic "1" is input as a result of the comparison, and updates the digital code D such that the digital code increases in a case where logic "0" is input as a result of the comparison.

In a case where the digital code D is updated, the DAC 6 outputs electric charge in accordance with the updated digital code D. In a case where the digital code D is updated to decrease, the DAC 6 outputs electric charge so as to decrease the output voltage Vo. In other words, electric charge is drawn out from a feedback capacitor Cf.

As a result, the voltage input to the comparison circuit 11 decreases. Then, a next successive comparison operation is started. Since the output Vx is less than 0 V in accordance with the previous successive comparison operation, the comparison circuit 11 outputs logic "0". Then, the SAR logic circuit 12 to which logic "0" is input updates the digital code D to increase.

In a case where the digital code D is updated, the DAC 6 outputs electric charge in accordance with the updated digital code D. In a case where the digital code D is updated to increase, the DAC 6 outputs electric charge so as to increase the output voltage Vo. In other words, the feedback capacitor Cf is charged.

As a result, the output voltage Vo increases, and the output Vx is increased as well. Thereafter, a similar successive comparison operation is repeated, and the output Vx approaches 0 V.

According to the operation described above, a configuration including the comparison circuit 11, the SAR logic circuit 12, and the DAC 6 operate as an amplification circuit that causes the output Vx to approach 0 V by quantizing the output Vx supplied from the residual voltage storing unit 2 by using the SAR-ADC and charging the feedback capacitor Cf by using electric charge corresponding to the acquired digital code D.

In the present embodiment, the conversion unit 5 is used commonly in a time divisional manner as a part of the amplification circuit used for the amplification of the output of the residual voltage storing unit 3. For this reason, the number of the constituent elements of the amplification circuit used for amplifying the residual voltage stored by the residual voltage storing unit 3 can be decreased. In addition, the amplification factor can be appropriately adjusted, for example, by using the ratio of the capacitance Cf of the feedback capacitance element 52 and the capacitance Cs of the capacitance elements 132, 142, and 182 of the residual voltage storing unit 2.

Figure 13:
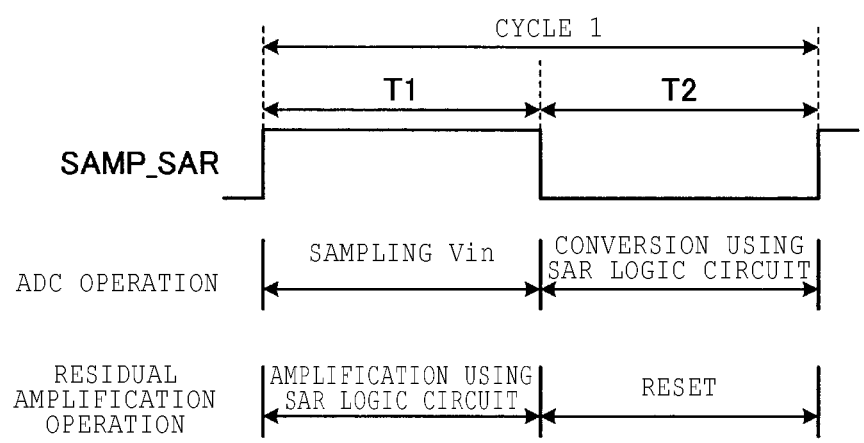
FIG. 13 illustrates an operation of the SAR-ADC according to the eighth embodiment.

The operation of the SAR-ADC according to the eighth embodiment will be described with reference to FIG. 13. Cycle 1 is a cycle for an AD conversion. An input voltage Vin is sampled in a period T1. In this period T1, the output of the residual voltage storing unit 2 is selected by the selection circuit 18 and is supplied to the comparison circuit 11. AD/DA conversions using the comparison circuit 11, the SAR logic circuit 12, and the DAC 6 are performed, and an operation of amplifying the residual voltage in accordance with an amplification factor set according to the ratio of the feedback capacitance Cf to the capacitance of the capacitance element of the residual voltage storing unit 2 is performed.

In a period T2, the signal of the signal line 20 is selected by the selection circuit 18 and is supplied to the comparison circuit 11. An AD conversion operation using the comparison circuit 11 and the SAR logic circuit 12 is performed, and a digital signal Dout is output.

Figure 14:
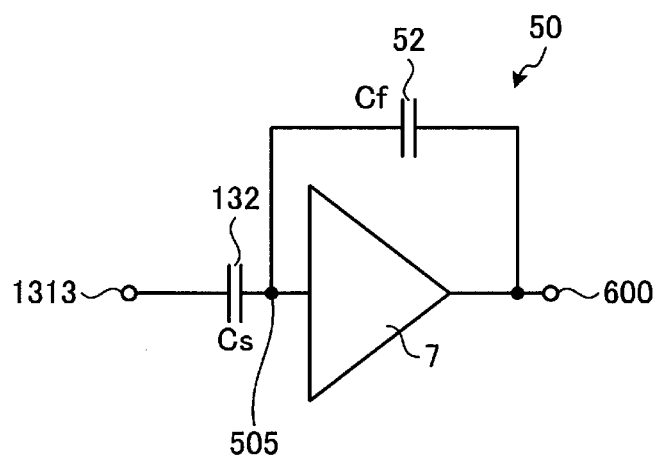
FIG. 14 illustrates a method of setting an amplification factor of an amplification circuit.

FIG. 14 illustrates a method of setting an amplification factor in a case where the conversion unit 5 of the SAR-ADC is commonly used as a part of the amplification circuit. FIG. 14 illustrates a state in which the capacitance element 132 of the residual voltage storing circuit 2A of the residual voltage storing unit 2 illustrated in FIG. 7 is connected to the terminal 1332. The operational amplifier 7 includes the comparison circuit 11 of the conversion unit 5 and the SAR logic circuit 12 and the DAC 6. The amplification factor can be appropriately set by using the ratio (Cs/Cf) of the capacitance Cs of the capacitance element 132 of the residual voltage storing circuit 2A to the capacitance Cf of the feedback capacitance element 52.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

In addition, configurations as described in the following supplementary notes may be considered.

(Supplementary Note 1)

The successive approximation register AD converter according to claim 1, wherein the capacitance DA converter, the residual voltage storing unit, and the residual voltage adding unit have an entire differential configuration.

(Supplementary Note 2)

The successive approximation register AD converter according to claim 2, wherein the amplifier includes an operational amplifier and a capacitance element connected between the input and the output of the operational amplifier.

(Supplementary Note 3)

The successive approximation register AD converter according to claim 2, further including a switch that grounds the output port of the amplifier.

(Supplementary Note 4)

The successive approximation register AD converter according to claim 5, further including a DA converter that is connected to the SAR logic circuit, and the output of the DA converter is supplied to the selection circuit in the middle of the amplifying operation.

(Supplementary Note 5)

A successive approximation register AD converter including: a first capacitance DA converter to which a first input signal is supplied; a first signal line to which an output of the first capacitance DA converter is supplied; a second capacitance DA converter to which a second input signal is supplied; a second signal line to which an output of the second capacitance DA converter is supplied; a comparison circuit to which voltages of the first and second signal lines are supplied; a first feedback circuit that maintains a residual voltage of the first signal line and feeds back the maintained residual voltage to the second signal line after a predetermined delay time; and a second feedback circuit that maintains a residual voltage of the second signal line and feeds back the maintained residual voltage to the first signal line after a predetermined delay time, wherein the first feedback circuit includes: a first residual voltage storing unit that includes a plurality of capacitance elements to which the voltage of the first signal line is supplied at predetermined timing; a first residual voltage adding unit that includes a capacitance element having one end connected to the second signal line; and a first selection circuit that selects one of the plurality of capacitance elements of the first residual voltage storing unit and supplies an output of the selected capacitance element to the capacitance element of the first residual voltage adding unit, and the second feedback circuit includes: a second residual voltage storing unit that includes a plurality of capacitance elements to which the voltage of the second signal line is supplied at predetermined timing; a second residual voltage adding unit that includes a capacitance element having one end connected to the first signal line; and a second selection circuit that selects one of the plurality of capacitance elements of the second residual voltage storing unit and supplies an output of the selected capacitance element to the capacitance element of the second residual voltage adding unit.

What is claimed is:

1. A successive approximation register analog-to-digital converter, comprising:
   a capacitance digital-to-analog converter (CDAC) having an input terminal to which an analog signal is input and an output terminal from which an output voltage is output;
   a voltage storing circuit connected to the output terminal and including a plurality of capacitors connected in parallel, the output voltage being stored in a selected one of the capacitors;
   a selector configured to output a voltage stored in the selected one of the capacitors;
   a comparator configured to compare a voltage input to an input terminal thereof, which is connected to the output terminal of the CDAC, with a reference voltage; and
   a successive approximation register (SAR) configured to control the CDAC based on an output of the comparator, and cyclically control the voltage storing circuit and the selector, such that the output of the selector is output to the output terminal one or more cycles after the output voltage was stored in the selected one of the capacitors.

2. The successive approximation register analog-to-digital converter according to claim 1, wherein
   the SAR is configured to output a digital output signal based on outputs of the comparator.

3. The successive approximation register analog-to-digital converter according to claim 1, wherein
   the output of the selector is output to the output terminal two or more cycles after the output voltage was stored in the selected one of the capacitors.

4. The successive approximation register analog-to-digital converter according to claim 1, wherein
   during each cycle, the output voltage is stored in a one of the capacitors, and a voltage stored in another one of the capacitors is output through the selector.

5. The successive approximation register analog-to-digital converter according to claim 1, wherein
   the voltage storing circuit includes three or more capacitors connected in parallel, and during each cycle, the output voltage is stored in a one of the capacitors, and voltages stored in two or more of the other capacitors are output through the selector.

6. The successive approximation register analog-to-digital converter according to claim 1, wherein
the SAR controls the selected one of the capacitors to output a stored voltage during two or more consecutive cycles.

7. The successive approximation register analog-to-digital converter according to claim 1, further comprising:
an amplifier configured to amplify a voltage from the selected one of the capacitors.

8. The successive approximation register analog-to-digital converter according to claim 7, wherein
the amplifier is connected between the voltage storing circuit and the selector.

9. The successive approximation register analog-to-digital converter according to claim 1, further comprising:
an adding circuit configured to output an output voltage of the selector to the output terminal through a capacitor of the adding circuit.

10. The successive approximation register analog-to-digital converter according to claim 9, wherein
the adding circuit includes a plurality of capacitors connected in parallel, and a plurality of output voltages of the selector are output to the output terminal through the plurality of capacitors of the adding circuit, respectively.

11. The successive approximation register analog-to-digital converter according to claim 1, further comprising:
a second CDAC having an input terminal to which the analog signal is input and an output terminal from which an output voltage is output;
a second comparator configured to compare a voltage input to an input terminal thereof, which is connected to the output terminal of the second CDAC, with a first offset voltage;
a third CDAC having an input terminal to which the analog signal is input and an output terminal from which an output voltage is output; and
a third comparator configured to compare a voltage input to an input terminal thereof, which is connected to the output terminal of the third CDAC, with a second offset voltage.

12. A successive approximation register analog-to-digital converter, comprising:
a first capacitance digital-to-analog converter (CDAC) having a first input terminal to which a first analog signal is input and a first output terminal from which a first output voltage is output;
a first voltage storing circuit connected to the first output terminal and including a plurality of capacitors connected in parallel, the first output voltage being stored in a selected one of the capacitors;
a second CDAC having a second input terminal to which a second analog signal is input and a second output terminal from which a second output voltage is output;
a second voltage storing circuit connected to the second output terminal and including a plurality of capacitors connected in parallel, the second output voltage being stored in a selected one of the capacitors of the second voltage storing circuit;
a comparator configured to compare a voltage input to a third input terminal thereof, which is connected to the first output terminal of the first CDAC, with a voltage input to a fourth input terminal thereof, which is connected to the second output terminal of the second CDAC; and
a successive approximation register (SAR) configured to control the first and second CDACs based on an output of the comparator, and cyclically control the first voltage storing circuit to output a voltage stored in the selected one of the capacitors of the first voltage storing circuit to one of the first and second output terminals, and the second voltage storing circuit to output a voltage stored in the selected one of the capacitors of the second voltage storing circuit to the other one of the first and second output terminals.

13. The successive approximation register analog-to-digital converter according to claim 12, wherein
the voltage stored in the selected one of the capacitors of the first voltage storing circuit is output to the first output terminal, and
the voltage stored in the selected one of the capacitors of the second voltage storing circuit is output to the second output terminal.

14. The successive approximation register analog-to-digital converter according to claim 13, wherein
the voltage stored in the selected one of the capacitors of the first voltage storing circuit is output to the first output terminal two or more cycles after the first output voltage was stored in the selected one of the capacitors of the first voltage storing circuit, and
the voltage stored in the selected one of the capacitors of the second voltage storing circuit is output to the second output terminal two or more cycles after the second output voltage was stored in the selected one of the capacitors of the second voltage storing circuit.

15. The successive approximation register analog-to-digital converter according to claim 12, wherein
the voltage stored in the selected one of the capacitors of the first voltage storing circuit is output to the second output terminal, and
the voltage stored in the selected one of the capacitors of the second voltage storing circuit is output to the first output terminal.

16. The successive approximation register analog-to-digital converter according to claim 15, wherein
the voltage stored in the selected one of the capacitors of the first voltage storing circuit is output to the second output terminal two or more cycles after the first output voltage was stored in the selected one of the capacitors of the first voltage storing circuit, and
the voltage stored in the selected one of the capacitors of the second voltage storing circuit is output to the first output terminal two or more cycles after the second output voltage was stored in the selected one of the capacitors of the second voltage storing circuit.

17. The successive approximation register analog-to-digital converter according to claim 12, wherein
the SAR is configured to output a digital output signal based on outputs of the comparator.

18. A successive approximation register analog-to-digital converter, comprising:
a capacitance digital-to-analog converter (CDAC) having an input terminal to which an analog signal is input and an output terminal from which an output voltage is output;
a voltage storing circuit connected to the output terminal and including a plurality of capacitors connected in parallel, the output voltage being stored in a selected one of the capacitors;

a selector configured to output a selected one of the output voltage of the CDAC and an output voltage of the voltage storing circuit;

a comparator configured to compare a voltage input to an input terminal thereof, which is connected to an output terminal of the selector, with a reference voltage; and a successive approximation register (SAR) configured to control the CDAC and the selector based on an output of the comparator, and cyclically control the voltage storing circuit.

19. The successive approximation register analog-to-digital converter according to claim 18, wherein each cycle has a first period during which the output voltage is stored in the selected one of the capacitors and the selector selects the output voltage of the voltage storing circuit, and a second period during which the selector selects the output voltage of the CDAC.

20. The successive approximation register analog-to-digital converter according to claim 18, wherein the SAR is configured to output a digital output signal based on outputs of the comparator.

* * * * *